United States Patent
Partridge et al.

(10) Patent No.: US 7,371,609 B2
(45) Date of Patent: May 13, 2008

(54) STACKED MODULE SYSTEMS AND METHODS

(75) Inventors: Julian Partridge, Austin, TX (US); James Douglas Wehrly, Jr., Austin, TX (US)

(73) Assignee: Staktek Group L.P., Austin, TX (US)

( * ) Notice: Subject to any disclaimer, the term of this patent is extended or adjusted under 35 U.S.C. 154(b) by 201 days.

(21) Appl. No.: 10/836,855

(22) Filed: Apr. 30, 2004

(65) Prior Publication Data
US 2004/0201091 A1    Oct. 14, 2004

Related U.S. Application Data (63) Continuation-in-part of application No. PCT/US03/29000, filed on Sep. 15, 2003, which is a continuation-in-part of application No. 10/453,398, filed on Jun. 3, 2003, and a continuation-in-part of application No. 10/005,581, filed on Oct. 26, 2001, now Pat. No. 6,576,992.

(51) Int. Cl.
*H01L 21/00* (2006.01)

(52) U.S. Cl. .................. 438/109; 257/686; 361/749

(58) Field of Classification Search .............. 408/107, 408/108, 109; 257/686, 777, 778, 723–724; 361/735, 790, 767, 749; 438/108–109
See application file for complete search history.

(56) References Cited

U.S. PATENT DOCUMENTS

| | | | |
|---|---|---|---|
| 3,411,122 A | 11/1968 | Schiller et al. | |
| 3,436,604 A | 4/1969 | Hyltin | 317/101 |
| 3,654,394 A | 4/1972 | Gordon | |
| 3,727,064 A | 4/1973 | Bottini | |
| 3,746,934 A | 7/1973 | Stein | 317/101 |
| 3,766,439 A | 10/1973 | Isaacson | |
| 3,772,776 A | 11/1973 | Weisenburger | 29/628 |
| 3,806,767 A | 4/1974 | Lehrfeld | |

(Continued)

FOREIGN PATENT DOCUMENTS

DE     004215467 A1    11/1992

(Continued)

OTHER PUBLICATIONS

Dense-Pac Microsystems, Breaking Space Barriers, 3-D Technology 1993.

(Continued)

*Primary Examiner*—Zandra V. Smith
*Assistant Examiner*—Thanh Y. Tran
(74) *Attorney, Agent, or Firm*—Fish & Richardson P.C.

(57) ABSTRACT

The present invention stacks chip scale-packaged integrated circuits (CSPs) into modules that conserve PWB or other board surface area. In a preferred embodiment in accordance with the invention, a form standard associated with one or more CSPs provides a physical form that allows many of the varying package sizes found in the broad family of CSP packages to be used to advantage while employing a standard connective flex circuitry design. In a preferred embodiment, the contacts of the lower CSP will be compressed before flex circuitry is attached to a combination of the CSP and a form standard to create lower profile contacts between CSP and the flex circuitry.

17 Claims, 6 Drawing Sheets

U.S. PATENT DOCUMENTS

| | | | |
|---|---|---|---|
| 3,983,547 A | 9/1976 | Almasi | |
| 4,079,511 A | 3/1978 | Grabbe | |
| 4,103,318 A | 7/1978 | Schwede | |
| 4,288,841 A | 9/1981 | Gogal | 361/414 |
| 4,381,421 A | 4/1983 | Coats et al. | |
| 4,398,235 A | 8/1983 | Lutz et al. | |
| 4,406,508 A | 9/1983 | Sadigh-Behzadi | |
| 4,420,794 A | 12/1983 | Anderson | |
| 4,437,235 A | 3/1984 | McIver | |
| 4,513,368 A | 4/1985 | Houseman | |
| 4,587,596 A | 5/1986 | Bunnell | |
| 4,645,944 A | 2/1987 | Uya | |
| 4,696,525 A | 9/1987 | Coller et al. | 439/69 |
| 4,712,129 A | 12/1987 | Orcutt | |
| 4,722,691 A | 2/1988 | Gladd et al. | |
| 4,733,461 A | 3/1988 | Nakano | |
| 4,758,875 A | 7/1988 | Fujisaki et al. | |
| 4,763,188 A | 8/1988 | Johnson | |
| 4,821,007 A | 4/1989 | Fields et al. | |
| 4,823,234 A | 4/1989 | Konishi et al. | 361/386 |
| 4,833,568 A | 5/1989 | Berhold | 361/383 |
| 4,839,717 A | 6/1989 | Phy et al. | |
| 4,862,249 A | 8/1989 | Carlson | |
| 4,884,237 A | 11/1989 | Mueller et al. | |
| 4,891,789 A | 1/1990 | Quattrini et al. | |
| 4,903,169 A | 2/1990 | Kitagawa et al. | |
| 4,911,643 A | 3/1990 | Perry et al. | 439/67 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,985,703 A | 1/1991 | Kaneyama | |
| 5,012,323 A | 4/1991 | Farnworth | |
| 5,016,138 A | 5/1991 | Woodman | |
| 5,034,350 A | 7/1991 | Marchisi | |
| 5,041,015 A | 8/1991 | Travis | 439/492 |
| 5,041,902 A | 8/1991 | McShane | |
| 5,050,039 A | 9/1991 | Edfors | |
| 5,057,903 A | 10/1991 | Olla | |
| 5,064,782 A | 11/1991 | Nishiguchi | |
| 5,068,708 A | 11/1991 | Newman | |
| 5,081,067 A | 1/1992 | Shimizu et al. | |
| 5,099,393 A | 3/1992 | Bentlage et al. | 361/413 |
| 5,104,820 A | 4/1992 | Go et al. | |
| 5,117,282 A | 5/1992 | Salatino | |
| 5,122,862 A | 6/1992 | Kajihara et al. | |
| 5,138,430 A | 8/1992 | Gow, III et al. | 357/70 |
| 5,138,434 A | 8/1992 | Wood et al. | |
| 5,158,912 A | 10/1992 | Kellerman et al. | |
| 5,159,434 A | 10/1992 | Kohno et al. | 357/80 |
| 5,159,535 A | 10/1992 | Desai et al. | |
| 5,168,926 A | 12/1992 | Watson et al. | |
| 5,198,888 A | 3/1993 | Sugano et al. | |
| 5,198,965 A | 3/1993 | Curtis et al. | |
| 5,214,307 A | 5/1993 | Davis | |
| 5,219,794 A | 6/1993 | Satoh et al. | |
| 5,222,014 A | 6/1993 | Lin | 361/414 |
| 5,224,023 A | 6/1993 | Smith et al. | 361/412 |
| 5,229,641 A | 7/1993 | Katayama | |
| 5,229,916 A | 7/1993 | Frankeny et al. | |
| 5,239,198 A | 8/1993 | Lin et al. | 257/693 |
| 5,240,588 A | 8/1993 | Uchida | |
| 5,241,454 A | 8/1993 | Ameen et al. | 361/744 |
| 5,243,133 A | 9/1993 | Engle et al. | |
| 5,247,423 A | 9/1993 | Lin et al. | 361/719 |
| 5,252,855 A | 10/1993 | Ogawa et al. | |
| 5,252,857 A | 10/1993 | Kane et al. | |
| 5,259,770 A | 11/1993 | Bates et al. | 439/66 |
| 5,261,068 A | 11/1993 | Gaskins et al. | |
| 5,262,927 A | 11/1993 | Chia et al. | |
| 5,276,418 A | 1/1994 | Klosowiak et al. | |
| 5,279,029 A | 1/1994 | Burns | |
| 5,281,852 A | 1/1994 | Normington | 257/685 |
| 5,289,062 A | 2/1994 | Wyland | |
| 5,289,346 A | 2/1994 | Carey et al. | |
| 5,311,401 A | 5/1994 | Gates, Jr. et al. | |
| 5,313,097 A | 5/1994 | Haj-Ali-Ahmadi et al. | 257/706 |
| 5,337,388 A | 8/1994 | Jacobowitz et al. | |
| 5,343,075 A | 8/1994 | Nishino | |
| 5,343,366 A | 8/1994 | Cipolla et al. | |
| 5,345,205 A | 9/1994 | Kornrumpf | |
| 5,347,159 A | 9/1994 | Khandros et al. | |
| 5,347,428 A | 9/1994 | Carson et al. | |
| 5,357,478 A | 10/1994 | Kikuda et al. | |
| 5,361,228 A | 11/1994 | Adachi et al. | |
| 5,362,656 A | 11/1994 | McMahon | |
| 5,375,041 A | 12/1994 | McMahon | 361/749 |
| 5,377,077 A | 12/1994 | Burns | |
| 5,384,690 A | 1/1995 | Davis et al. | |
| 5,386,341 A | 1/1995 | Olson et al. | |
| 5,394,010 A | 2/1995 | Tazawa et al. | |
| 5,394,303 A | 2/1995 | Yamaji | |
| 5,396,573 A | 3/1995 | Ecker et al. | |
| 5,397,916 A | 3/1995 | Normington | |
| 5,402,006 A | 3/1995 | O'Donley | |
| 5,420,751 A | 5/1995 | Burns | |
| 5,428,190 A | 6/1995 | Stopperan | 174/261 |
| 5,432,630 A | 7/1995 | Lebby et al. | |
| 5,438,224 A | 8/1995 | Papageorge et al. | |
| 5,446,620 A | 8/1995 | Burns et al. | |
| 5,448,511 A | 9/1995 | Paurus et al. | |
| 5,455,740 A | 10/1995 | Burns | |
| 5,475,920 A | 12/1995 | Burns et al. | |
| 5,477,082 A | 12/1995 | Buckley, III et al. | |
| 5,479,318 A | 12/1995 | Burns | |
| 5,484,959 A | 1/1996 | Burns | 174/524 |
| 5,493,476 A | 2/1996 | Burns | |
| 5,499,160 A | 3/1996 | Burns | |
| 5,502,333 A | 3/1996 | Bertin et al. | |
| 5,509,197 A | 4/1996 | Stone | |
| 5,514,907 A | 5/1996 | Moshayedi | |
| 5,516,989 A | 5/1996 | Uedo et al. | |
| 5,523,619 A | 6/1996 | McAllister et al. | |
| 5,523,695 A | 6/1996 | Lin | |
| 5,541,812 A | 7/1996 | Burns | |
| 5,543,664 A | 8/1996 | Burns | |
| 5,561,591 A | 10/1996 | Burns | |
| 5,566,051 A | 10/1996 | Burns | |
| 5,572,065 A | 11/1996 | Burns | 257/666 |
| 5,588,205 A | 12/1996 | Roane | |
| 5,592,364 A | 1/1997 | Roane | |
| 5,594,275 A | 1/1997 | Kwon et al. | |
| 5,610,833 A | 3/1997 | Chang et al. | |
| 5,612,570 A | 3/1997 | Eide et al. | 257/686 |
| 5,620,782 A | 4/1997 | Davis et al. | |
| 5,631,193 A | 5/1997 | Burns | |
| 5,642,055 A | 6/1997 | Difrancesco | |
| 5,644,161 A | 7/1997 | Burns | 257/668 |
| 5,644,839 A | 7/1997 | Stone | |
| 5,646,446 A | 7/1997 | Nicewarner, Jr. et al. | |
| 5,654,877 A | 8/1997 | Burns | |
| 5,657,537 A | 8/1997 | Saia et al. | |
| 5,677,569 A | 10/1997 | Choi et al. | |
| 5,717,556 A | 2/1998 | Yanagida | |
| 5,729,894 A | 3/1998 | Rostoker et al. | |
| 5,744,827 A | 4/1998 | Jeong et al. | |
| 5,751,553 A | 5/1998 | Clayton | |
| 5,763,296 A | 6/1998 | Casati et al. | |
| 5,764,497 A | 6/1998 | Mizumo et al. | |
| 5,776,552 A | 7/1998 | LeGuin | |
| 5,776,797 A * | 7/1998 | Nicewarner et al. | 438/107 |
| 5,778,522 A | 7/1998 | Burns | |
| 5,778,552 A | 7/1998 | LeGuin | 33/559 |
| 5,783,464 A | 7/1998 | Burns | |
| 5,789,815 A | 8/1998 | Tessier et al. | |

| | | | | | | | |
|---|---|---|---|---|---|---|---|
| 5,801,437 | A | 9/1998 | Burns .................. 257/685 | 6,320,137 | B1 | 11/2001 | Bonser et al. |
| 5,801,439 | A | 9/1998 | Fujisawa et al. | 6,323,060 | B1 | 11/2001 | Isaak .................. 438/109 |
| 5,804,870 | A | 9/1998 | Burns | 6,329,708 | B1 * | 12/2001 | Komiyama .................. 257/678 |
| 5,805,422 | A | 9/1998 | Otake et al. .................. 361/749 | 6,336,262 | B1 | 1/2002 | Dalal et al. |
| 5,828,125 | A | 10/1998 | Burns | 6,351,029 | B1 | 2/2002 | Isaak .................. 257/688 |
| 5,835,988 | A | 11/1998 | Ishii | 6,360,433 | B1 | 3/2002 | Ross |
| 5,841,721 | A | 11/1998 | Kwon et al. | 6,360,935 | B1 | 3/2002 | Flake |
| 5,852,326 | A | 12/1998 | Khandros et al. | 6,368,896 | B2 | 4/2002 | Farnworth et al. .......... 438/113 |
| 5,869,353 | A | 2/1999 | Levy et al. .................. 438/109 | 6,376,769 | B1 | 4/2002 | Chung |
| 5,895,969 | A | 4/1999 | Masuda et al. | 6,384,339 | B1 | 5/2002 | Neuman |
| 5,895,970 | A | 4/1999 | Miyoshi et al. | 6,392,162 | B1 | 5/2002 | Karabatsos .................. 174/261 |
| 5,899,705 | A | 5/1999 | Akram | 6,410,857 | B1 | 6/2002 | Gonya .................. 174/254 |
| 5,917,709 | A | 6/1999 | Johnson et al. | 6,414,384 | B1 | 7/2002 | Lo et al. |
| 5,922,061 | A | 7/1999 | Robinson | 6,423,622 | B1 | 7/2002 | Chen et al. |
| 5,925,934 | A | 7/1999 | Lim | 6,426,240 | B2 | 7/2002 | Isaak .................. 438/106 |
| 5,926,369 | A | 7/1999 | Ingraham et al. .......... 361/699 | 6,426,549 | B1 | 7/2002 | Isaak .................. 257/686 |
| 5,933,712 | A | 8/1999 | Bernhardt et al. | 6,426,560 | B1 | 7/2002 | Kawamura et al. |
| 5,949,657 | A | 9/1999 | Karabatsos .................. 361/803 | 6,433,418 | B1 | 8/2002 | Fujisawa et al. .............. 257/696 |
| 5,953,215 | A | 9/1999 | Karabatsos | 6,437,990 | B1 | 8/2002 | Degani et al. |
| 5,959,839 | A | 9/1999 | Gates | 6,444,490 | B2 | 9/2002 | Bertin et al. |
| 5,963,427 | A | 10/1999 | Bollesen | 6,444,921 | B1 | 9/2002 | Wang et al. .................. 174/260 |
| 5,973,395 | A | 10/1999 | Suzuki et al. | 6,446,158 | B1 | 9/2002 | Karabatsos |
| 5,995,370 | A | 11/1999 | Nakamori | 6,447,321 | B1 | 9/2002 | Perino et al. |
| 6,002,167 | A | 12/1999 | Hatano et al. | 6,449,159 | B1 | 9/2002 | Haba |
| 6,002,589 | A | 12/1999 | Perino et al. | 6,452,826 | B1 | 9/2002 | Kim et al. |
| 6,013,948 | A | 1/2000 | Akram et al. | 6,462,408 | B1 | 10/2002 | Wehrly, Jr. |
| 6,014,316 | A | 1/2000 | Eide .......................... 361/735 | 6,462,412 | B2 | 10/2002 | Kamei et al. .................. 257/723 |
| 6,025,642 | A | 2/2000 | Burns | 6,462,423 | B1 | 10/2002 | Akram et al. |
| 6,028,352 | A | 2/2000 | Eide | 6,465,877 | B1 | 10/2002 | Farnworth et al. .......... 257/668 |
| 6,028,365 | A | 2/2000 | Akram et al. .................. 257/778 | 6,465,893 | B1 | 10/2002 | Khandros et al. .......... 257/777 |
| 6,034,878 | A | 3/2000 | Osaka et al. | 6,473,308 | B2 | 10/2002 | Forthun |
| 6,040,624 | A | 3/2000 | Chambers et al. | 6,486,544 | B1 | 11/2002 | Hashimoto .................. 257/686 |
| 6,072,233 | A | 6/2000 | Corisis et al. .............. 257/686 | 6,487,078 | B2 | 11/2002 | Kledzik et al. |
| 6,084,293 | A | 7/2000 | Ohuchi | 6,489,178 | B2 | 12/2002 | Coyle et al. |
| 6,084,294 | A | 7/2000 | Tomita | 6,489,687 | B1 | 12/2002 | Hashimoto |
| 6,084,778 | A | 7/2000 | Malhi | 6,492,718 | B2 | 12/2002 | Ohmori |
| 6,097,087 | A | 8/2000 | Farnworth et al. .......... 257/698 | 6,500,697 | B2 | 12/2002 | Ahmad |
| 6,102,710 | A | 8/2000 | Beilin et al. | 6,504,104 | B2 | 1/2003 | Hacke et al. |
| 6,111,761 | A | 8/2000 | Peana et al. | 6,509,639 | B1 | 1/2003 | Lin |
| 6,114,763 | A | 9/2000 | Smith | 6,514,793 | B2 | 2/2003 | Isaak .................. 438/109 |
| 6,121,676 | A | 9/2000 | Solberg | 6,522,018 | B1 | 2/2003 | Tay et al. |
| RE36,916 | E | 10/2000 | Moshayedi | 6,528,870 | B2 | 3/2003 | Fukatsu et al. |
| 6,130,477 | A | 10/2000 | Chen et al. | 6,532,162 | B2 | 3/2003 | Schoenborn |
| 6,157,541 | A | 12/2000 | Hacke | 6,538,895 | B2 | 3/2003 | Worz et al. |
| 6,165,817 | A | 12/2000 | Akram | 6,549,413 | B2 | 4/2003 | Karnezos et al. |
| 6,166,443 | A | 12/2000 | Inaba et al. | 6,552,910 | B1 | 4/2003 | Moon et al. |
| 6,172,874 | B1 | 1/2001 | Bartilson .................. 361/719 | 6,559,521 | B2 | 5/2003 | Tuttle |
| 6,178,093 | B1 | 1/2001 | Bhatt et al. | 6,560,117 | B2 | 5/2003 | Moon .................. 361/749 |
| 6,186,106 | B1 | 2/2001 | Glovatsky | 6,572,387 | B2 | 6/2003 | Burns et al. |
| 6,187,652 | B1 | 2/2001 | Chou et al. | 6,576,992 | B1 | 6/2003 | Cady et al. |
| 6,205,654 | B1 | 3/2001 | Burns | 6,588,095 | B2 * | 7/2003 | Pan .................. 29/611 |
| 6,208,521 | B1 | 3/2001 | Nakatsuka .................. 361/749 | 6,590,282 | B1 | 7/2003 | Wang et al. .................. 257/686 |
| 6,218,731 | B1 | 4/2001 | Huang et al. | 6,600,222 | B1 | 7/2003 | Levardo .................. 257/686 |
| 6,222,737 | B1 | 4/2001 | Ross | 6,608,763 | B1 | 8/2003 | Burns et al. |
| 6,225,688 | B1 | 5/2001 | Kim et al. .................. 257/686 | 6,614,664 | B2 | 9/2003 | Lee |
| 6,233,650 | B1 | 5/2001 | Johnson et al. | 6,617,510 | B2 | 9/2003 | Schreiber et al. |
| 6,234,820 | B1 | 5/2001 | Perino et al. | 6,620,651 | B2 | 9/2003 | He et al. .................. 438/113 |
| 6,236,565 | B1 | 5/2001 | Gordon | 6,624,507 | B1 | 9/2003 | Nguyen et al. |
| 6,262,476 | B1 | 7/2001 | Vidal | 6,627,984 | B2 | 9/2003 | Bruce et al. |
| 6,262,895 | B1 | 7/2001 | Forthun .................. 361/749 | 6,646,333 | B1 | 11/2003 | Hogerl |
| 6,265,660 | B1 | 7/2001 | Tandy .................. 174/52.4 | 6,657,134 | B2 | 12/2003 | Spielberger et al. |
| 6,265,766 | B1 | 7/2001 | Moden | 6,660,561 | B2 | 12/2003 | Forthun |
| 6,266,252 | B1 | 7/2001 | Karabatsos | 6,670,700 | B1 | 12/2003 | Hashimoto |
| 6,271,058 | B1 * | 8/2001 | Yoshida .................. 438/108 | 6,673,651 | B2 | 1/2004 | Ohuchi et al. |
| 6,272,741 | B1 | 8/2001 | Kennedy et al. | 6,677,670 | B2 | 1/2004 | Kondo |
| 6,281,577 | B1 | 8/2001 | Oppermann et al. ........ 257/724 | 6,683,377 | B1 * | 1/2004 | Shim et al. .................. 257/723 |
| 6,285,560 | B1 | 9/2001 | Lyne | 6,689,634 | B1 | 2/2004 | Lyne |
| 6,288,907 | B1 | 9/2001 | Burns | 6,690,584 | B2 | 2/2004 | Uzuka et al. |
| 6,300,679 | B1 * | 10/2001 | Mukerji et al. .............. 257/738 | 6,699,730 | B2 | 3/2004 | Kim et al. |
| 6,303,981 | B1 | 10/2001 | Moden | 6,707,148 | B1 | 3/2004 | Mostafazedeh et al. |
| 6,310,392 | B1 | 10/2001 | Burns | 6,707,684 | B1 | 3/2004 | Andric et al. |
| 6,313,998 | B1 | 11/2001 | Kledzik | 6,709,893 | B2 | 3/2004 | Moden et al. |
| 6,316,825 | B1 | 11/2001 | Park et al. | 6,724,076 | B1 | 4/2004 | Kahlisch et al. |

| | | |
|---|---|---|
| 6,746,894 B2 | 6/2004 | Fee et al. |
| 6,762,495 B1 | 7/2004 | Reyes et al. |
| 6,762,769 B2 | 7/2004 | Guo et al. |
| 6,765,288 B2 | 7/2004 | Damberg |
| 6,768,660 B2 | 7/2004 | Kong et al. |
| 6,773,848 B1 | 8/2004 | Nortoft et al. |
| 6,776,797 B1 | 8/2004 | Blom |
| 6,778,404 B1 | 8/2004 | Bolken et al. |
| 6,781,240 B2 | 8/2004 | Choi et al. |
| 6,803,651 B1 | 10/2004 | Chiang |
| 6,812,567 B2 | 11/2004 | Kim et al. |
| 6,821,029 B1 | 11/2004 | Grung et al. |
| 6,833,984 B1 | 12/2004 | Belgacem |
| 6,841,855 B2 | 1/2005 | Jaeck et al. |
| 6,849,949 B1 | 2/2005 | Lyu et al. |
| 6,867,496 B1 | 3/2005 | Hashimoto |
| 6,869,825 B2 | 3/2005 | Chiu |
| 6,876,074 B2 | 4/2005 | Kim |
| 6,879,047 B1 | 4/2005 | Heo |
| 6,884,653 B2 | 4/2005 | Larson |
| 6,891,729 B2 | 5/2005 | Ko et al. |
| 6,893,897 B2 | 5/2005 | Sweterlitsch |
| 6,908,792 B2 | 6/2005 | Bruce et al. |
| 6,914,324 B2 | 7/2005 | Rapport et al. |
| 6,919,626 B2 | 7/2005 | Burns |
| 6,965,166 B2 | 11/2005 | Hikita et al. |
| 6,998,704 B2 | 2/2006 | Yamazaki et al. |
| 7,023,701 B2 | 4/2006 | Stocken et al. |
| 7,081,373 B2 | 7/2006 | Roeters et al. |
| 7,104,804 B2 | 9/2006 | Batinovich |
| 7,129,571 B2 | 10/2006 | Kang |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0035572 A1 | 11/2001 | Isaak |
| 2001/0040793 A1 | 11/2001 | Inaba |
| 2002/0006032 A1 | 1/2002 | Karabatsos |
| 2002/0030995 A1 | 3/2002 | Shoji |
| 2002/0044423 A1* | 4/2002 | Primavera et al. .......... 361/704 |
| 2002/0048849 A1 | 4/2002 | Isaak |
| 2002/0076919 A1 | 6/2002 | Peters et al. |
| 2002/0101261 A1 | 8/2002 | Karabatsos |
| 2002/0114143 A1 | 8/2002 | Morrison et al. |
| 2002/0126951 A1 | 9/2002 | Sutherland et al. |
| 2002/0139577 A1 | 10/2002 | Miller .................. 174/261 |
| 2002/0164838 A1 | 11/2002 | Moon et al. .............. 438/107 |
| 2002/0180022 A1 | 12/2002 | Emoto .................. 257/686 |
| 2003/0016710 A1* | 1/2003 | Komoto .................. 372/36 |
| 2003/0045025 A1 | 3/2003 | Coyle et al. |
| 2003/0049886 A1 | 3/2003 | Salmon |
| 2003/0081392 A1 | 5/2003 | Cady et al. |
| 2003/0107118 A1 | 6/2003 | Pflughaupt et al. |
| 2003/0109078 A1 | 6/2003 | Takahashi et al. |
| 2003/0113998 A1 | 6/2003 | Ross |
| 2003/0146518 A1* | 8/2003 | Hikita et al. ............. 257/777 |
| 2003/0164551 A1 | 9/2003 | Lee et al. |
| 2003/0168725 A1 | 9/2003 | Warner et al. |
| 2004/0000708 A1 | 1/2004 | Rapport et al. |
| 2004/0004281 A1 | 1/2004 | Bai et al. |
| 2004/0021211 A1 | 2/2004 | Damberg |
| 2004/0031972 A1 | 2/2004 | Pflughaupt et al. |
| 2004/0045159 A1 | 3/2004 | DiStefano et al. |
| 2004/0065963 A1 | 4/2004 | Karnezos |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. |
| 2004/0157352 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0047250 A1 | 3/2005 | Ruckerbauer et al. |
| 2005/0133897 A1 | 6/2005 | Baek et al. |

FOREIGN PATENT DOCUMENTS

| | | |
|---|---|---|
| DE | 004214102 A1 | 12/1992 |
| EP | 0 298 211 A | 1/1989 |
| EP | 0426-303 A2 | 10/1990 |
| EP | 461-639 A | 12/1991 |
| JP | 58-96756 A | 6/1983 |
| JP | 58-112348 A | 7/1983 |
| JP | 359088863 A | 5/1984 |
| JP | 60-254762 | 12/1985 |
| JP | 60-254762 A | 12/1985 |
| JP | 60254762 | 12/1985 |
| JP | 3641047659 A | 3/1986 |
| JP | 62-230027 A | 8/1987 |
| JP | 62-230027 A | 10/1987 |
| JP | 4-209562 A | 7/1992 |
| JP | 404368167 A | 12/1992 |
| JP | 50-29534 A | 2/1993 |
| JP | 63-153849 A | 6/1998 |
| JP | 2000-88921 | 3/2000 |
| JP | 2000/307029 A | 11/2000 |
| JP | 2001077294 A | 3/2001 |
| JP | 2001085592 A | 3/2001 |
| JP | 2001332683 A | 11/2001 |
| JP | 2003037246 A | 2/2003 |
| JP | 2003086760 A | 3/2003 |
| JP | 2003086761 A | 3/2003 |
| JP | 2003/309247 A | 10/2003 |
| JP | 2003309246 A | 10/2003 |
| JP | 2003/347475 A | 12/2003 |
| JP | 2003/347503 A | 12/2003 |
| WO | WO9744824 | 11/1997 |
| WO | WO 03/037053 A1 | 5/2003 |

OTHER PUBLICATIONS

Dense-Pac Microsystems, DPS512X16A3, Ceramic 512K×16 CMOS SRAM Module.

"Design Techniques for Ball Grid Arrays," William R. Newberry, Xynetix Design Systems, Inc.

"Chip Scale Packaging and Redistribution," Paul A. Magill, Glenn A. Rinne, J. Daniel Mis, Wayne C. Machon, Joseph W. Baggs, Unitive Electronics Inc.

"3D Interconnection for Ultra-Dense Multichip Modules," Christian Val, Thomson-CSF DCS Computer Division, Thierry Lemoine, Thomson-CSF RCM Radar Countermeasures Division.

"High Density Memory Packaging Technology High Speed Imaging Applications," Dean Frew, Texas Instruments Incorporated.

Teresa Technologies, Inc.—Semiconductor Intellectual Property, Chip Scale Packaging—Website pp. 3.

"Tessera Introduces uZ™—Ball Stacked Memory Package for Computing and Portable Electronic Products" Joyce Smaragdis, Tessera Public Relations; 2 figures that purport to be directed to the uZ™—Ball Stacked Memory Package.

Ron Bauer, Intel. "Stacked-CSP Delivers Flexibility, Reliability, and Space-Saving Capabilities", Spring 2002.

Tesseru uZ Ball Stack Package. 4 figures that purport to be directed to the uZ—Ball Stacked Memory, 1 Page.

"Vertically-Intergrated Package," Alvin Weinberg, Pacesetter, Inc. and W. Kinzy Jones, Florida International University.

Flexible Printed Circuit Technology—A Versatile Interconnection Option. (Website 2 pages) Fjelstad, Joseph. Dec. 3, 2002.

Chip Scale Packaging and Redistribution, Paul A. Magill, Glen A. Rinne, J. Daniel Mis, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

PCT/US2006/017015, International Search Report and Written Opinion dated Oct. 17, 2006.

PCT/US2005/013345, International Preliminary Report on Patentability dated Nov. 2, 2006.

PCT/US2005/016764; International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2005/013336, International Preliminary Report on Patentability dated Nov. 9, 2006.

Howard W. Markstein, Western Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays. 1997 published on the Internet.

William R. Newberry, Design Techniques for Ball Grid Arrays, Xynetix Design Systems, Inc., Portland, Maine, Published on the Internet.

Tessera Technologies, Inc.—Semiconductor Intellectual Property, Chip Scale Packaging—Website pp. 3, Published on Internet.

Tessera Introduces uZ ä—Ball Stacked Memory Package for Computing and Portable Electronic Products, OYCE Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002, San Jose, CA.

Ron Bauer, Intel. "Stacked-CSP Delivers Flexibility, Reliability, and Space-Saving Capabilities", Spring 2002, Published on the Internet.

Tessera uZ Ball Stack Package. 4 figures that purport to be directed to the uZ—Ball Stacked Memory, Published on the Internet.

Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.

Flexible Thinking: Examining the Flexible Circuit Tapes. (Website 2 pages) Fjelstad, Joseph., Published Apr. 20, 2000 on Internet.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

\* cited by examiner

STACKED MODULE SYSTEMS AND METHODS

RELATED APPLICATIONS

This application is a continuation-in-part of U.S. patent application Ser. No. 10/453,398, filed Jun. 3, 2003, which is a continuation-in-part of U.S. patent application Ser. No. 10/005,581, filed Oct. 26, 2001, now U.S. Pat. No. 6,576, 992 and a continuation-in-part of PCT App. No. PCT/US03/29000, filed Sep. 15, 2003.

U.S. patent application Ser. No. 10/453,398, filed Jun. 3, 2003, is hereby incorporated by reference.

PCT Pat App. PCT/US03/29000, filed Sep. 15, 2003, is hereby incorporated by reference.

TECHNICAL FIELD

The present invention relates to aggregating integrated circuits and, in particular, to stacking integrated circuits in chip-scale packages.

BACKGROUND OF THE INVENTION

A variety of techniques are used to stack packaged integrated circuits. Some methods require special packages, while other techniques stack conventional packages.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package. The absence of "leads" on package sides renders most stacking techniques devised for leaded packages inapplicable for CSP stacking.

A variety of previous techniques for stacking CSPs typically present complex structural arrangements and thermal or high frequency performance issues. For example, thermal performance is a characteristic of importance in CSP stacks.

What is needed, therefore, is a technique and system for stacking CSPs that provides a thermally efficient, reliable structure that performs well at higher frequencies but does not add excessive height to the stack yet allows production at reasonable cost with readily understood and managed materials and methods.

SUMMARY OF THE INVENTION

The present invention stacks chip scale-packaged integrated circuits (CSPs) into modules that conserve PWB or other board surface area. Although the present invention is applied most frequently to chip scale packages that contain one die, it may be employed with chip scale packages that include more than one integrated circuit die. Multiple numbers of CSPs may be stacked in accordance with the present invention. The CSPs employed in stacked modules devised in accordance with the present invention are connected with flex circuitry. That flex circuitry may exhibit one or two or more conductive layers.

In the present invention, at least one form standard is employed to provide a physical form that allows many of the varying package sizes found in the broad family of CSP packages to be used to advantage while employing a standard connective flex circuitry design. In a preferred embodiment, the form standard will be devised of heat transference material, a metal, for example, such as copper would be preferred, to improve thermal performance.

In constructing modules in accordance with some preferred modes of the invention, CSP contacts are reduced in height to create lower profile modules. With some of the preferred methods of the present invention, the compressed contacts mix with solder paste and set beneficially as lower diameter contacts. This creates low profile embodiments of the modules of the present invention.

DESCRIPTION OF PREFERRED EMBODIMENTS

Figure 1:
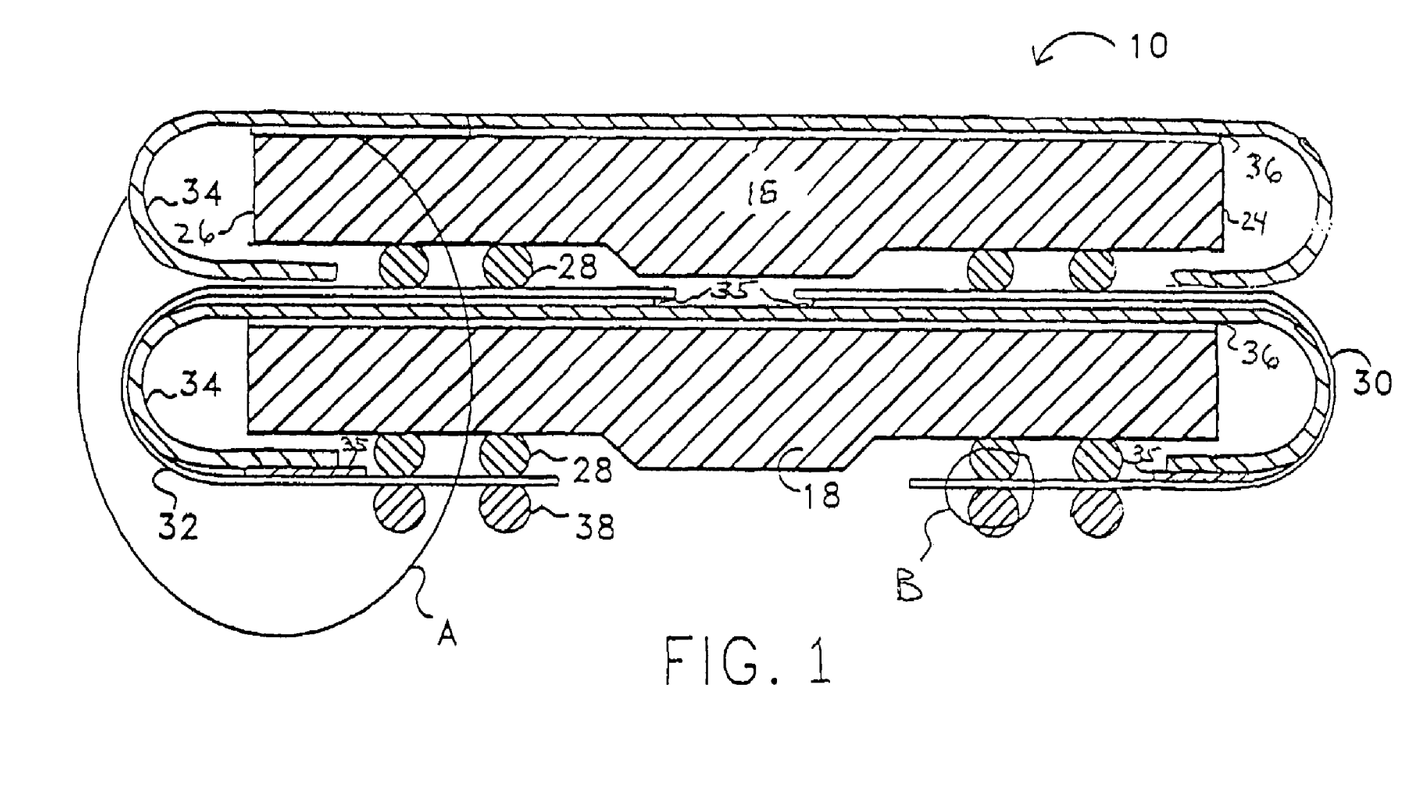
FIG. 1 is an elevation view of a high-density circuit module devised in accordance with a preferred two-high embodiment of the present invention.

FIG. 1 shows a two-high module 10 devised in accordance with a preferred embodiment of the invention. FIG. 1 has an area marked "A" that is subsequently shown in enlarged depiction in FIG. 2. Module 10 is comprised of two CSPs: CSP 16 and CSP 18. Each of the CSPs has an upper surface 20 and a lower surface 22 and opposite lateral edges 24 and 26 and typically include at least one integrated circuit surrounded by a plastic body 27. The body need not be plastic, but a large majority of packages in CSP technologies are plastic. Those of skill will realize that the present invention may be devised to create modules with different size CSPs and that the constituent CSPs may be of different types within the same module 10. For example, one of the constituent CSPs may be a typical CSP having lateral edges 24 and 26 that have an appreciable height to present a "side" while other constituent CSPs of the same module 10 may be devised in packages that have lateral edges 24 and 26 that are more in the character of an edge rather than a side having appreciable height.

The term CSP should be broadly considered in the context of this application. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views are depicted with CSPs of a particular profile known to those in the art, but it should be understood that the figures are exemplary only. The invention may be employed to advantage in the wide range of CSP configurations available in the art where an array of connective elements is available from at least one major surface. The invention is advantageously employed with CSPs that contain memory circuits, but may be employed to advantage with logic and computing circuits where added capacity without commensurate PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 22 of a plastic casing in any of several patterns and pitches. An external portion of the connective contacts is often finished with a ball of solder. Shown in FIG. 1 are contacts 28 along lower surfaces 22 of the illustrated constituent CSPs 16 and 18. Contacts 28 provide connection to the integrated circuit or circuits within the respective packages.

In FIG. 1, flex circuitry ("flex", "flex circuits" or "flexible circuit structures") is shown connecting constituent CSPs 16 and 18. A single flex circuit may be employed in place of the two depicted flex circuits 30 and 32. The entirety of the flex circuitry may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed.

A first form standard 34 is shown disposed adjacent to upper surface 20 of CSP 18. A second form standard is also shown associated with CSP 16. Form standard 34 may be fixed to upper surface 20 of the respective CSP with an adhesive 36 which preferably is thermally conductive. Form standard 34 may also, in alternative embodiments, merely lay on upper surface 20 or be separated from upper surface 20 by an air gap or medium such as a thermal slug or non-thermal layer. A form standard may be employed on each CSP in module 10 for heat extraction enhancement as shown in the depiction of FIG. 1 which is a preferred mode for the present invention where heat extraction is a high priority. In other embodiments, form standard 34 may be inverted relative to the corresponding CSP so that, for example, it would be opened over the upper surface 20 of CSP 18.

Figure 5:
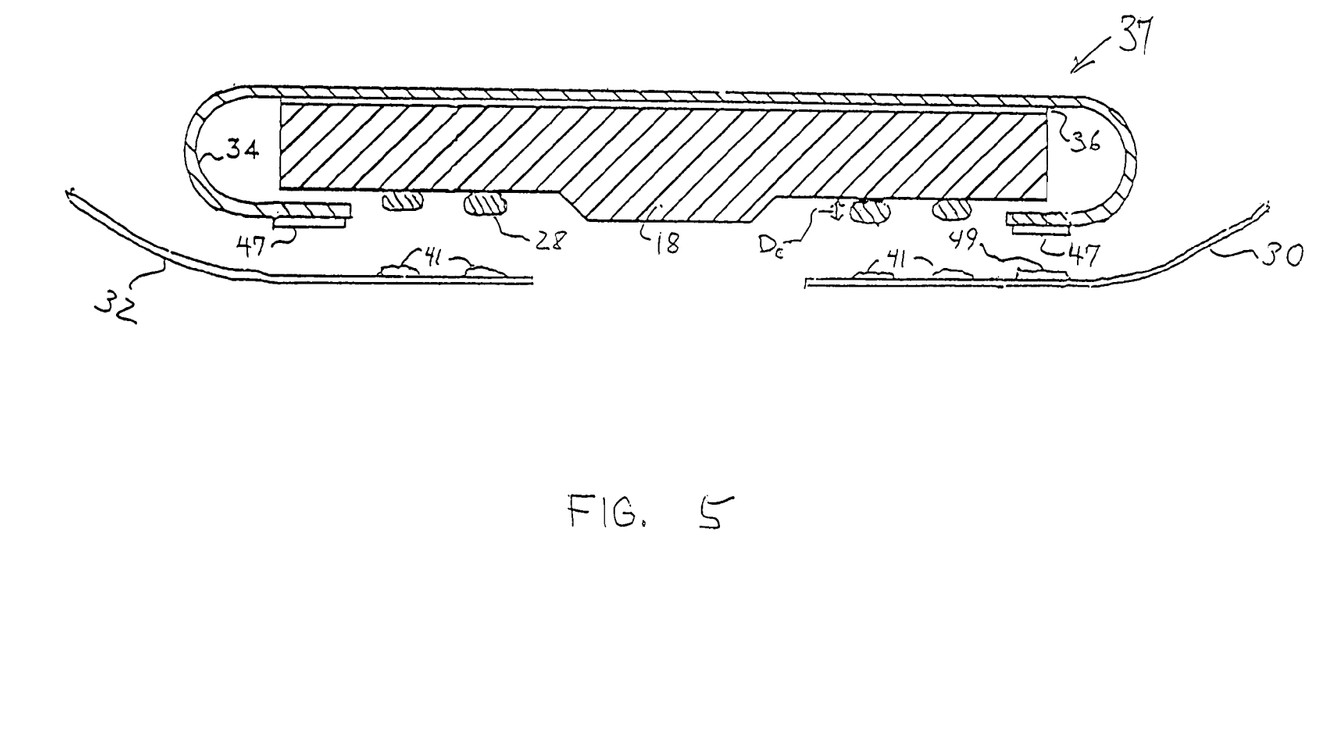
FIG. 5 depicts a preferred construction method that may be employed in making a high-density module devised in accordance with a preferred embodiment of the present invention.

Form standard 34 is, in a preferred embodiment, devised from copper to create, as shown in the depicted preferred embodiment of FIG. 1, a mandrel that mitigates thermal accumulation while providing a standard sized form about which flex circuitry is disposed. Form standard 34 may also be devised from nickel plated copper in preferred embodiments. Form standard 34 may take other shapes and forms such as, for example, an angular "cap" that rests upon the respective CSP body. It also need not be thermally enhancing although such attributes are preferable. The form standard 34 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32 as shown in FIG. 5) may be devised and used with the form standard 34 method and/or systems disclosed herein to create stacked modules with CSPs having different sized packages. This will allow the same flex circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e., flex circuitry). Further, as those of skill will recognize, mixed sizes of CSPs may be implemented into the same module 10, such as would be useful to implement embodiments of a system-on-a-stack such as those disclosed in co-pending application PCT/US03/29000, filed Sep. 15, 2003, which is incorporated by reference and commonly owned by the assignee of the present application.

In one preferred embodiment, portions of flex circuits 30 and 32 are fixed to form standard 34 by bonds 35 which are, in some preferred modes, metallurgical bonds created by placing on form standard 34, a first metal layer such as tin, for example, which, when melted, combines with a second metal that was placed on the flex circuitry or is part of the flex circuitry (such as the gold plating on a conductive layer of the flex) to form a higher melting point intermetallic bond that will not remelt during subsequent reflow operations as will be described further.

Figure 2:
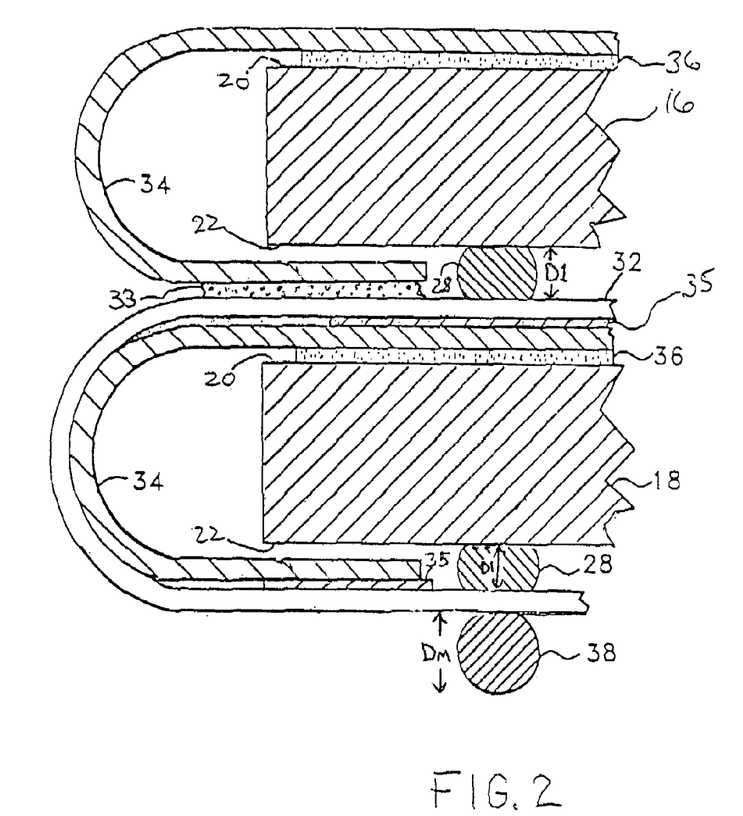
FIG. 2 depicts, in enlarged view, the area marked "A" in FIG. 1.

FIG. 2 depicts in enlarged view, the area marked "A" in FIG. 1. FIG. 2 illustrates in a preferred embodiment, an arrangement of a form standard 34 and its relation to flex circuitry 32 in a two-high module 10 that employs a form standard 34 with each of CSPs 16 and 18. The internal layer constructions of flex circuitry 32 are not shown in this figure. Shown in greater detail than in FIG. 1, are bonds 35 that will be described with reference to later Figs. Also shown in FIG. 2 is an application of adhesive 36 between form standards 34 and CSPs 18 and 16. In a preferred embodiment, an adhesive 33 may also be employed between form standard 34 associated with CSP 16 and the flex circuitry 32. Adhesive 33 will preferably be thermally conductive.

Figure 3:
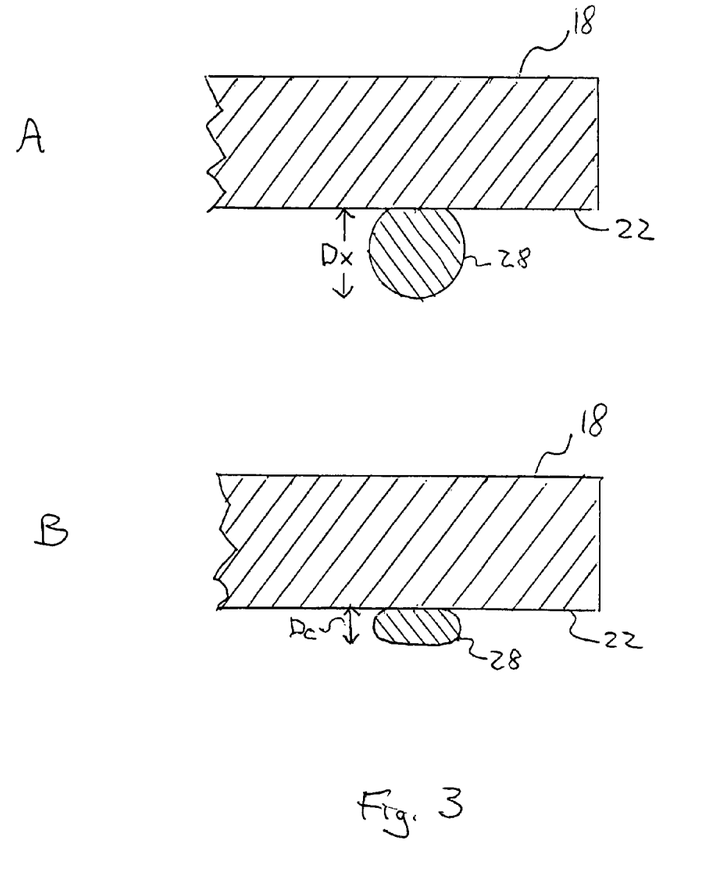
FIG. 3A depicts a part of an exemplar CSP before its incorporation into a module or unit of the present invention.
FIG. 3B depicts a part of an exemplar CSP after one of its contacts has been reduced in height according to a preferred mode of the present invention.
Figure 4:
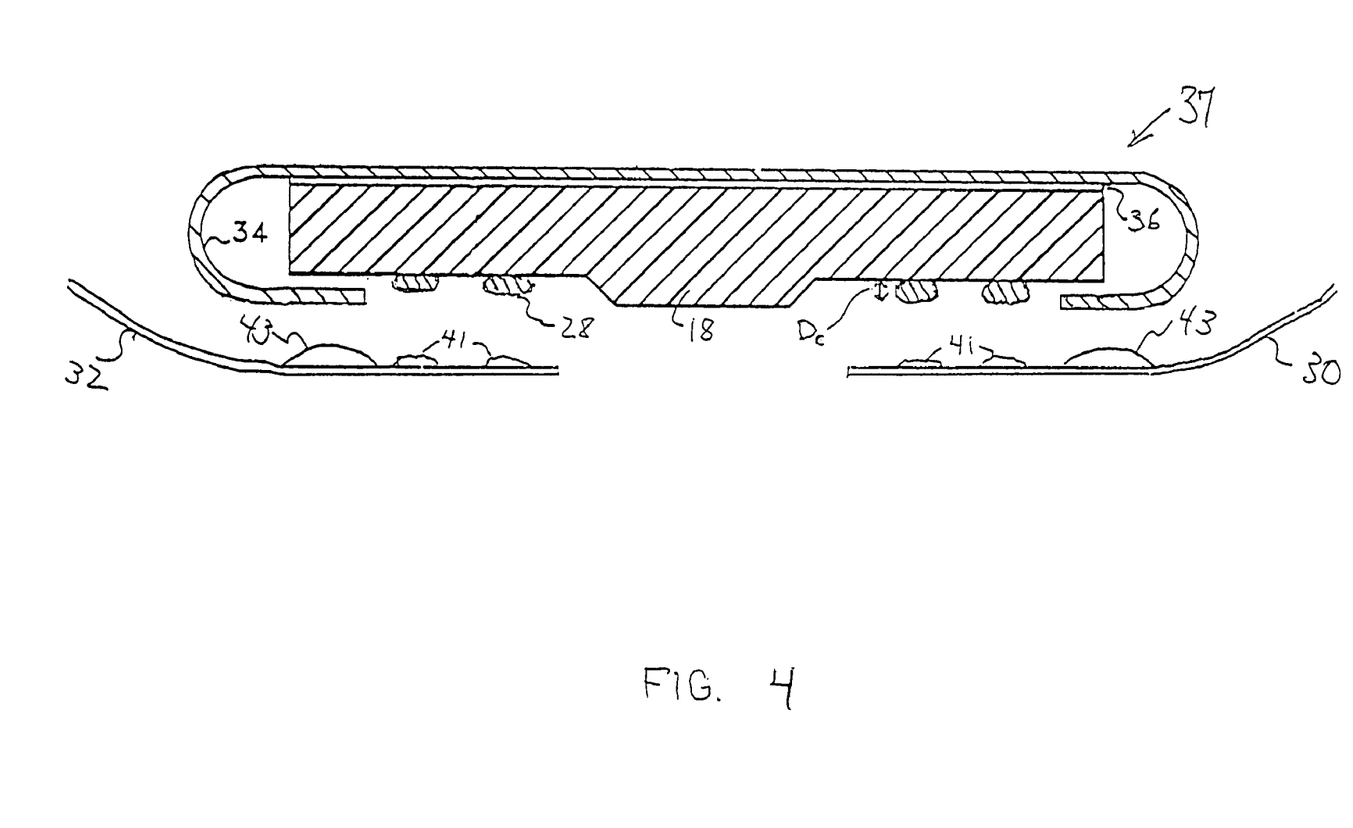
FIG. 4 depicts a preferred construction method that may be employed in making a high-density module devised in accordance with a preferred embodiment of the present invention.
Figure 6:
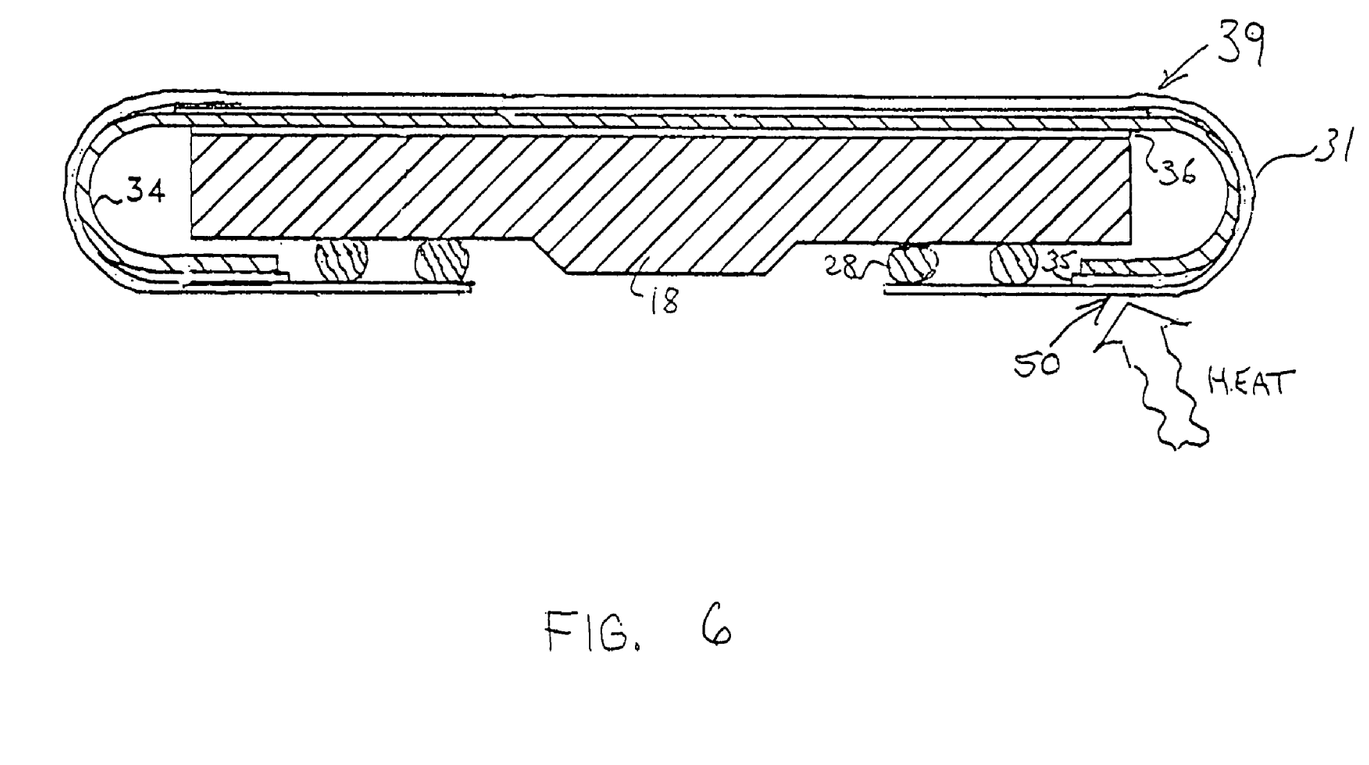
FIG. 6 depicts a unit that may be employed in a module devised in accordance with a preferred embodiment of the present invention.

Although those of skill will recognize that the Figs. are not drawn to scale, the contacts 28 of CSPs 16 and 18 have been shown to have (although need not exhibit in every embodiment) a limited height above the lower surface 22 of the corresponding CSP. FIG. 3A depicts a contact 28 of CSP 18 before that contact 28 has undergone the step of height reduction described further subsequently. As shown, contact 28 rises a height Dx above surface 22 of CSP 18. FIG. 3B depicts contact 28 after the step of height reduction described further subsequently. In FIG. 3B, the height reduction was conducted before attachment of a form standard 34 to CSP 18. As is later explained, height reduction of contacts 28 may occur either before or after attachment of a form standard 34 to CSP 18. As shown, contact 28 rises a height Dc above surface 22 of CSP 18. With reference to FIG. 2, in some embodiments, contacts 28 may rise a height D1 above said surface 22 after incorporation of CSP 18 into module 10 or later shown unit 39 (FIG. 6.). Height D1 is greater than the height Dc such contacts exhibit after the step of contact height reduction, but before attachment of flex circuitry as shown in FIGS. 3B, 4, and 5. Even so, in preferred embodiments, height D1 of contacts 28 after CSP 18 is incorporated in a module 10 (such as shown in FIG. 2) or unit 39 (such as shown in FIG. 6) is less than height Dx which is the height above surface 22 exhibit by a CSP contact 28 before incorporation of CSP 18 into either a unit 39 (shown in FIG. 6) or module 10 and before contact height reduction according to preferred modes of the present invention. As shown in FIG. 2, module contacts 38 rise a height of Dm from flex circuit 32 and, in preferred embodiments of module 10, D1 is less than Dm.

With reference to FIG. 4, combination 37 is depicted as consisting of form standard 34 attached to CSP 18 which, when attached to flex circuitry, is adapted to be employed in module 10. The attachment of form standard 34 to CSP 18 may be realized with adhesive depicted by reference 36 which is preferably a film adhesive that is applied by heat tacking either to form standard 34 or CSP 18. A variety of other methods may be used to adhere form standard 34 to CSP 18 and in some embodiments, no adhesion may be used.

As further depicted in FIG. 4, flex circuits 30 and 32 are prepared for attachment to combination 37 by the application of solder paste 41 at sites that correspond to contacts 28 of CSP 18 to be connected to the flex circuitry. Also shown are glue applications indicated by references 43 which are, when glue is employed to attach form standard 34 to the flex circuitry, preferably liquid glue.

As shown in this embodiment, contacts 28 of CSP 18 have height Dc which is less than height D1 shown in earlier FIG. 2. The depicted contacts 28 of CSP 18 are reduced in height by compression or other means of height reduction before attachment of combination 37 to the flex circuitry. This compression may be done before or after attachment of form standard 34 and CSP 18 with after-attachment compression being preferred. Contacts 28 may be reduced in height while in a solid or semi-solid state. Unless reduced in height, contacts 28 on CSP 18 tend to "sit-up" on solder paste sites 41 during creation of module 10. This causes the glue line between the flex circuitry and form standard 34 to be thicker than may be desired. The glue reaches to fill the gap between the flex and form standard 34 that results from the distancing of the attached form standard 34 from the flex by the contacts 28 "sitting" upon the solder paste sites 41.

With a thicker glue line between flex and form standard 34, upon reflowing, the solder in contacts 28 mixes with solder paste 41 and reaches to span the space between CSP 18 and the flex circuitry which is now a fixed distance away from CSP 18. This results in a larger vertical dimension for contact 28 than is necessary due to the higher glue line and, consequently, a module 10 with a taller profile. The higher glue line was created by not reducing the contact diameters before attachment of the flex circuitry to the form standard 34 (or the form standard part of combination 37). With the preferred methods of the present invention, however, upon reflow, the compressed contacts 28 mix with solder paste 41 and set beneficially as lower diameter contacts 28. The resulting unit combining combination 37 with flex circuitry may then be employed to create low profile embodiment of module 10.

FIG. 5 depicts a preferred alternative and additional method to reduce module 10 height while providing a stable bond 35 between form standard 34 and the flex circuitry. The preferable bonds 35 that were earlier shown in FIG. 1 may be created by the following technique. As shown in FIG. 5, a first metallic material indicated by reference 47 has been layered on, or appended or plated to form standard 34. A second metallic material represented by reference 49 on flex circuit 30 is provided by, for example, applying a thin layer of metal to flex circuit 30 or, by exposing part of a conductive layer of the flex circuit. When form standard 34 is brought into proximity with the flex circuitry, and localized heating is applied to the area where the first and second metals 47 and 49 are adjacent, an intermetallic bond 35 is created. A preferred metallic material 47 would be a thin layer of tin applied to create a layer about 0.0005". When melted to combine with the gold of a conductive layer of flex circuitry exposed at that, for example, site, the resulting intermetallic bond 35 will have a higher melting point resulting in the additional advantage of not re-melting during subsequent re-flow operations at particular temperatures.

A variety of methods may be used to provide the localized heating appropriate to implement the metallic bonding described here including localized heat application with which many in the art are familiar as well as ultrasonic bonding methods where the patterns in the flex circuitry are not exposed to the vibration inherent in such methods and the metals chosen to implement the bonds have melting points within the range achieved by the ultrasonic method.

FIG. 6 depicts unit 39 comprised from flex circuitry 31 which, in this depicted embodiment, is a single flex circuit, and form standard 34 and CSP 18. Heat is shown as being applied to area 50 where the first metallic material 47 and second metallic material 49 were made adjacent by bringing combination 37 and flex circuitry 31 together.

The creation of intermetallic bonds may also be employed to bond combination 37 to flex circuitry along other sites where form standard 34 and flex circuitry are adjacent such as, for example, on sites or continuously along the top side of form standard where typically glue is otherwise applied to further fasten flex circuitry to form standard 34. The intermetallic bonding described here may be employed alone or with other methods such as the contact compression techniques described herein to create instances of module 10 that present a low profile.

In a preferred embodiment, flex circuits 30 and 32 are multi-layer flexible circuit structures that have at least two conductive layers. Other embodiments may, however, employ flex circuitry, either as one circuit or two flex circuits to connect a pair of CSPs, that have only a single conductive layer and may exhibit the variety of simple construction parameters that are known to those of skill in the art with such features as covercoats on one, both or neither side.

Preferably, the conductive layers are metal such as alloy 110 and as those of skill will know, often have conductive areas plated with gold. The use of plural conductive layers provides advantages and the creation of a distributed capacitance across module 10 intended to reduce noise or bounce effects that can, particularly at higher frequencies, degrade signal integrity, as those of skill in the art will recognize. Module 10 of FIG. 1 has plural module contacts 38. In embodiments where module 10 includes more than two IC's, there may be found connections between flex circuits which are typically balls but may be low profile contacts constructed with pads and/or rings that are connected with solder paste applications to appropriate connections. Appropriate fills can provide added structural stability and coplanarity where desired and, depending upon the fill, can improve thermal performance.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A method for devising a high-density circuit module, the method comprising the steps of:
providing a first CSP having a planar surface rising from which are contacts, the contacts each rising above the planar surface by a height H;
attaching a primary substantially rigid form standard to the first CSP to form a primary combination;
reducing the height H for each said contact; and
attaching the primary combination to two flex circuits to form a unit.

2. The method of claim 1 in which the flex circuits are each comprised of at least one conductive layer.

3. The method of claim 1 in which the flex circuits are each comprised of two conductive layers.

4. The method of claim 1 further comprising the steps of:
providing a second CSP;
disposing the second CSP above the unit; and
connecting the first and second CSPs with the at least one flex circuit.

5. The method of claim 1 further comprising the steps of:
providing a second CSP;
disposing the second CSP above the unit; and
connecting the first and second CSPs with the two flex circuits.

6. The method of claim 1 further comprising the steps of:
providing a second CSP;
attaching a supplemental form standard to the second CSP to form a supplemental combination;
disposing the supplemental combination above the unit; and
connecting the first CSP and the second CSP with the flex circuits.

7. The method of claim 6 in which the two flex circuits each comprise at least one conductive layer.

8. The method of claim 6 in which the two flex circuits each comprise two conductive layers.

9. A high-density circuit module devised in accordance with claim 6.

10. The circuit module of claim 9 in which the flex circuits each comprises two conductive layers.

11. A high-density circuit module devised in accordance with claim 1.

12. A method for devising a high-density circuit module, the method comprising the steps of:
providing a first CSP having a planar surface rising above which are contacts, the contacts each rising above the planar surface by a height H;
attaching a substantially rigid form standard to the first CSP to form a primary combination;
reducing the height H for each said contact;
providing two flex circuits upon which are located, solder paste sites;
disposing the primary combination adjacent to the flex circuits to realize areas of contact between the solder paste sites and the contacts that rise above the planar surface of the first CSP;
attaching the substantially rigid form standard of the combination to the flex circuits to create a unit; and
selectively heating the areas of contact between the solder paste sites and the contacts to form connections between the first CSP and the flex circuits.

13. The method of claim 12 further comprising the step of disposing a second CSP above the unit and connecting the flex circuits to the second CSP.

14. The method of claims 12 or 13 in which the flex circuits each comprises at least one conductive layer.

15. The method of claims 12 or 13 in which the flex circuits each comprises two conductive layers.

16. A high-density circuit module devised by a method comprising the steps of:
providing a substantially rigid form standard;
providing first and second CSPs;
attaching the substantially rigid form standard to the first CSP;
applying a first metallic material to at least one part of the substantially rigid form standard;
providing two flex circuits, each with an area where flex metallic material is exposed;
disposing the flex circuits adjacent to the substantially rigid form standard to create an area of contact between the flex metallic material and the first metallic material;
selectively applying heat to the area of contact.

17. A high-density circuit module comprising:
a rigid form standard;
first and second CSPs, the rigid form standard being attached to the first CSP;
a first metallic material attached to at least a substantial portion of the rigid form standard;
flex circuitry with two flex circuits each having two conductive layers, at least one of the two flex circuits being adjacent to the rigid form standard to create an area of contact between the flex metallic material and the first metallic material.

* * * * *